(12) United States Patent
Janssen et al.

(10) Patent No.: US 9,896,765 B2
(45) Date of Patent: Feb. 20, 2018

(54) PRE-TREATMENT PROCESS FOR ELECTROLESS PLATING

(71) Applicant: Atotech Deutschland GmbH, Berlin (DE)

(72) Inventors: Boris Alexander Janssen, Berlin (DE); Donny Lautan, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 0 days.

(21) Appl. No.: 15/112,205

(22) PCT Filed: Jan. 14, 2015

(86) PCT No.: PCT/EP2015/050612
§ 371 (c)(1),
(2) Date: Jul. 18, 2016

(87) PCT Pub. No.: WO2015/124331
PCT Pub. Date: Aug. 27, 2015

(65) Prior Publication Data
US 2016/0348246 A1  Dec. 1, 2016

(30) Foreign Application Priority Data

Feb. 21, 2014  (EP) .................................... 14156103

(51) Int. Cl.
| | | |
|---|---|---|
| *B05D 3/10* | (2006.01) | |
| *C23C 18/32* | (2006.01) | |
| *C23C 18/18* | (2006.01) | |
| *C23C 18/16* | (2006.01) | |
| *C23C 18/50* | (2006.01) | |
| *C23F 1/30* | (2006.01) | |
| *C23F 1/02* | (2006.01) | |

(Continued)

(52) U.S. Cl.
CPC .......... *C23C 18/32* (2013.01); *C23C 18/1608* (2013.01); *C23C 18/1841* (2013.01);
(Continued)

(58) Field of Classification Search
CPC . C23C 18/1841; C23C 18/1608; C23C 18/32; C23C 18/34; C23C 18/36;
(Continued)

(56) References Cited

U.S. PATENT DOCUMENTS

| | | | |
|---|---|---|---|
| 5,843,538 A | 12/1998 | Ehrsam et al. | |
| 2005/0109734 A1* | 5/2005 | Kuriyama | ................ C23F 1/28 216/108 |

(Continued)

FOREIGN PATENT DOCUMENTS

| | | | |
|---|---|---|---|
| CN | 101120621 | 2/2008 | |
| WO | WO 2011149019 A1 * | 12/2011 | ....... H01L 23/49827 |

OTHER PUBLICATIONS

PCT/EP2015/050612; PCT International Search Report and Written Opinion of the International Searching Authority dated Jun. 12, 2015.

(Continued)

*Primary Examiner* — Dah-Wei D Yuan
*Assistant Examiner* — Ngaleung V Law
(74) *Attorney, Agent, or Firm* — Renner, Otto, Boisselle & Sklar, LLP

(57) ABSTRACT

The present invention discloses a process for electroless plating of a metal or metal alloy onto copper features of an electronic device such as a printed circuit board which suppresses undesired skip plating and extraneous plating. The process comprises the steps i) providing such a substrate, ii) activating of the copper features with noble metal ions; iii) removing excessive noble metal ions or precipitates formed thereof with an aqueous pre-treatment composition comprising an acid, a source for halide ions and an additive selected from the group consisting of thiourea, thiourea derivatives and polymers comprising thiourea groups, and iv) electroless plating of a metal or metal alloy layer.

14 Claims, 3 Drawing Sheets

(51) Int. Cl.
  *C23F 1/44* (2006.01)
  *H05K 3/26* (2006.01)
  *H05K 3/18* (2006.01)
  *H05K 3/24* (2006.01)
  *C23C 18/42* (2006.01)

(52) U.S. Cl.
  CPC .............. *C23C 18/42* (2013.01); *C23C 18/50* (2013.01); *C23F 1/02* (2013.01); *C23F 1/30* (2013.01); *C23F 1/44* (2013.01); *H05K 3/187* (2013.01); *H05K 3/244* (2013.01); *H05K 3/26* (2013.01)

(58) Field of Classification Search
  CPC ... C23C 18/50; C23F 1/02; C23F 1/30; H05K 3/26; H05K 3/244
  See application file for complete search history.

(56) References Cited

U.S. PATENT DOCUMENTS

| | | | |
|---|---|---|---|
| 2006/0252252 A1* | 11/2006 | Zhu | B82Y 30/00 438/618 |
| 2008/0073614 A1 | 3/2008 | Akiyama et al. | |
| 2009/0022885 A1 | 1/2009 | Matsumoto et al. | |
| 2011/0051387 A1 | 3/2011 | Tachibana et al. | |
| 2013/0058062 A1* | 3/2013 | Tachibana | H01L 23/49827 361/783 |

OTHER PUBLICATIONS

PCT/EP2015/050612; PCT International Preliminary Report on Patentability dated Jun. 16, 2016.
Search Report for corresponding Chinese Application No. 201580009251.9 dated May 4, 2017 and its English translation.

* cited by examiner

PRIOR ART

PRIOR ART

PRE-TREATMENT PROCESS FOR ELECTROLESS PLATING

The present application is a U.S. National Stage Application based on and claiming benefit and priority under 35 U.S.C. § 371 of International Application No. PCT/EP2015/050612, filed 14 Jan. 2015, which in turn claims benefit of and priority to European Application No. 14156103.5 filed 21 Feb. 2014, the entirety of both of which is hereby incorporated herein by reference.

FIELD OF THE INVENTION

The present invention relates to a surface finishing process in manufacture of printed circuit boards (PCB), IC substrates, microchips and related electronic devices. The process according to the present invention is used to suppress extraneous and skip metal or metal alloy plating on a substrate having a copper patterned surface after activation with noble metal ions when depositing a metal or metal alloy layer by electroless (autocatalytic) plating thereon.

BACKGROUND OF THE INVENTION

Surface finishing processes for metal deposition in the manufacture of printed circuit boards, IC substrates, microchips and related electronic devices are employed to provide bondable and/or solderable surface areas whereon active and passive components can be mechanically and electrically contacted to electronic devices. Frequently applied surface finishing processes are the ENIG process (Electroless Nickel Immersion Gold) and Ni/Pd(/Au) processes. In both types of processes, a copper surface of an electronic device is activated with an activation composition containing noble metal ions followed by electroless (autocatalytic) deposition of a metal or metal alloy layer thereon.

An activation of a copper surface prior to electroless plating of e.g. nickel is required because copper is classified as a non-catalytic metal for electroless deposition of for example nickel deposited from hypophosphite containing electrolytes (W. Riedel, Electroless Nickel Plating, ASM International, reprint 1998, p. 189). The purpose of the activation step is to deposit an immersion coating of a catalyst on the copper surface. The catalyst lowers the activation energy and allows a metal such as nickel or a metal alloy such as a nickel-phosphorous alloy to be deposited on the copper surface by electroless plating. Examples of suitable catalysts are palladium and ruthenium (Printed Circuits Handbook, Ed.: C. F. Coombs, Jr., McGraw-Hill, 2001, p. 32.3). Usually, a palladium seed layer is immersion plated onto the copper surface, wherein the palladium ions are deposited onto the copper surface, reduced by copper to metallic state palladium and copper ions are released into the immersion plating bath. The copper surface is then coated with metallic palladium which serves as a seed/catalyst for the following electroless metal or metal alloy plating.

It is important to rinse the substrate carefully between activation of the copper surface with noble metal ions and electroless metal or metal alloy plating to remove all excessive noble metal ions. Otherwise precipitates formed of e.g. noble metal hydroxides can lead to extraneous (uncontrolled) metal or metal alloy deposition around individual copper features on the substrate surface, surfaces made of plastic materials and other dielectric materials.

The phrase 'plastic materials' comprises bare PCB laminates, solder masks and photoimageable resists such as dry film resists. Other materials which can be affected by said uncontrolled deposition of noble metal ions or precipitates thereof comprise silicon dioxide, silicon and non-metallic glasses.

The noble metal ion precipitates act as seed/catalyst for uncontrolled and undesired deposition of a metal or metal alloy during electroless plating. Typical phenomena of extraneous metal or metal alloy plating are for example nickel bridges and nickel feet formed during electroless plating of nickel. Extraneous plating leads for example to circuit shorts, especially in high density circuits with line and space widths of 50 µm or less. Extraneous metal or metal alloy deposits have a weak adhesion on laminate and solder mask surfaces and can fracture off the PCB and then also cause circuit shorts at other locations of the PCB. Metal and metal alloy bridges between individual copper contact pads or copper trenches can directly result in circuit shorts. Metal and metal alloy feet around copper contact pads in fine line circuits also can cause circuit shorts by bridging individual copper contact pads.

The problem of extraneous plating, particularly of nickel is known in the prior art and different approaches towards this problem are described:

US 2001/0040047 teaches a method which reduces bridging that can occur during plating. Said method comprises the following steps: contacting a circuitized substrate with a swelling agent, treating the substrate with a composition of an alkaline permanganate, a chromate or chlorite salt followed by applying a metal layer on the treated circuitized portion of the substrate. The method is an alternative to the process according to the present invention as no noble metal ion activation is applied.

US 2008/0073614 A1 discloses an acidic etchant for metallic palladium comprising at least 500 mg/l thiourea. Such an etchant is not suitable to selectively remove palladium ions or precipitates thereof and results in undesired skip plating (Example 5).

The patent document EP 0 707 093 discloses an activator which will selectively activate the copper surfaces for electroless nickel plating and thereby minimize or eliminate extraneous plating. Said activator composition comprises an imidazole compound and may further contain palladium ions.

Excess noble metal ions during activation of a copper surface tend to hydrolyze in the rinse step(s) applied before electroless plating of nickel and form noble metal-containing precipitates. Said precipitates can be adsorbed onto surface areas of the substrate that are made of plastic or other dielectric materials or can be trapped in cavities formed between structural features made of copper and plastic or other dielectric materials, e.g., laminates, photoresists and/or solder masks on the substrate surface. Said precipitates can be reduced to metallic state noble metal by the reducing agent present in the electroless metal or metal alloy plating bath utilized for depositing the metal or metal alloy layer onto the substrate (step iv. of the process according to the present invention). Metal or metal alloy plating will occur on such reduced noble metal precipitates. If the reduced noble metal is present on surface areas of the substrate other than the copper surface, unwanted extraneous metal or metal alloy plating can occur and lead to undesired circuit shorts.

A rinse step is applied after activation with noble metal ions in order to remove all excess noble metal ions before contacting the substrate with the electroless metal or metal alloy plating composition. On the other hand, hydrolysis and precipitation of noble metal ions occurs preferably during such rinse steps. Therefore, at least one rinse step is usually done in a rinse solution consisting of diluted sulfuric acid.

But in case of high density circuits the sulfuric acid rinse is not sufficient to suppress extraneous metal or metal alloy plating.

Another method to suppress undesired extraneous metal and metal alloy plating is disclosed in EP 2233608 A1. The substrate is contacted with an aqueous composition comprising an organic aminocarboxylic acid after activation of the substrate with noble metal ions and prior to electroless nickel plating.

A method for depositing a nickel alloy onto a metal substrate by electroless plating is disclosed in U.S. Pat. No. 5,843,538 A. The substrate is contacted, in this order, with an aqueous solution comprising an organic acid and a fluorosurfactant, then with an activator solution comprising palladium ions and then with an electroless nickel plating bath which comprises thiourea as a stabilizer additive. Extraneous plating is not suppressed by this method.

A palladium removal treatment is disclosed in US 2013/005862 A1. A copper surface is contacted after activation with palladium ions with an alkaline solution comprising a sulfur compound. Such alkaline solutions suppress extraneous plating but result in undesired skip plating of the copper surface, i.e. palladium is also removed from the copper surface where it should remain in order to initiate electroless nickel plating (Examples 9 and 10).

An etchant for metals such as palladium comprising hydrochloric acid and thiourea is disclosed in US 2005/0109734 A1. This etchant is applied to remove oxides from the surface of metals such as palladium prior to etching of metallic palladium. Accordingly, said etchant is not suitable to selectively remove metallic palladium from a substrate without causing undesired skip plating.

In addition, palladium ions or precipitates formed thereof are adsorbed onto the copper contact pads and should not be removed before electroless plating in order to prevent skip plating. Skip plating is an undesired phenomenon wherein an incomplete metal or metal plating occurs on the copper contact pads. Accordingly, such skip plating results in a disrupted metal or metal alloy layer on top of the copper contact pads and leads to failures during bonding and soldering.

OBJECTIVE OF THE PRESENT INVENTION

Figure 1:
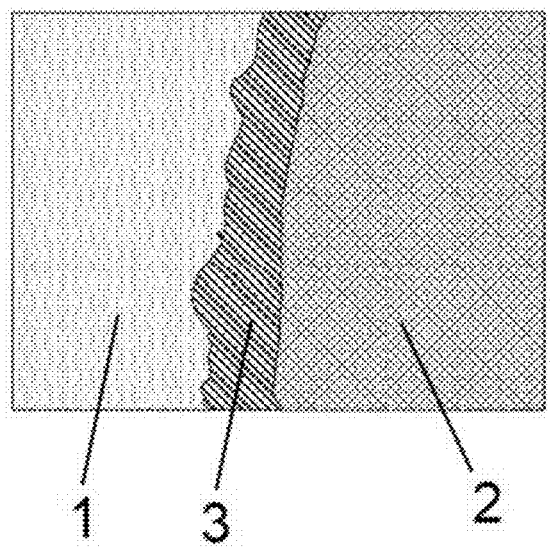
FIG. 1 shows a top view of a copper bond pad coated with a metal (or metal alloy) 2 deposited by autocatalytic plating on a PCB substrate 1 with undesired extraneous plating 3 (Examples 1 and 2).

It is the objective of the present invention to provide a process for electroless (autocatalytic) plating of a metal or metal alloy layer onto a substrate comprising a copper surface which suppresses the undesired formation of extraneous metal or metal alloy between individual features of said copper surface such as copper contact pads and at the same time results in a non-disrupted metal or metal alloy layer on top of said individual features of the copper surface.

SUMMARY OF THE INVENTION

This objective is solved by a process for electroless (autocatalytic) metal and metal alloy plating according to the present invention which comprises, in the following order, the steps of
  i. providing a substrate comprising a copper surface,
  ii. contacting said substrate with a noble metal ion containing composition; thereafter
  iii. contacting said substrate with an aqueous pre-treatment composition comprising an acid, a source for halide ions and an additive selected from the group consisting of thiourea, compounds according to formula (1)

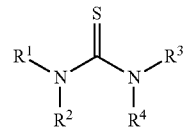

(1)

wherein $R^1$, $R^2$ and $R^3$ are independently selected from the group consisting of H, substituted $C_1$ to $C_6$ alkyl and unsubstituted $C_1$ to $C_6$ alkyl, and $R^4$ is selected from the group consisting of H, substituted $C_1$ to $C_6$ alkyl, unsubstituted $C_1$ to $C_6$ alkyl and —N($R^7$)—C(S)—N$R^5R^6$ wherein $R^5$, $R^6$ and $R^7$ are independently selected from the group consisting of H, substituted $C_1$ to $C_6$ alkyl and unsubstituted $C_1$ to $C_6$ alkyl,
compounds according to formula (2)

$$R^8\text{—C(S)—N}R^9R^{10} \qquad (2)$$

wherein $R^8$ is selected from the group consisting of H, substituted $C_1$ to $C_6$ alkyl and unsubstituted $C_1$ to $C_6$ alkyl and $R^9$ and $R^{10}$ are independently selected from the group consisting of H, substituted $C_1$ to $C_6$ alkyl and unsubstituted $C_1$ to $C_6$ alkyl and polymers comprising thiourea groups wherein the concentration of said additive ranges from 1 to 200 mg/l; and
  iv. depositing a metal or metal alloy layer onto said substrate by electroless (autocatalytic) plating.

Undesired extraneous plating and skip plating of a metal or metal alloy deposited by electroless (autocatalytic) plating can be successfully suppressed when applying the process according to the present invention.

DETAILED DESCRIPTION OF THE INVENTION

The deposition of noble metal ions or precipitates formed thereof shall only occur on surface areas of the substrate comprising a copper surface designated for electroless (autocatalytic) metal and metal alloy plating. This can be achieved by applying the aqueous pre-treatment composition for electroless metal and metal alloy plating according to the present invention. Said aqueous pre-treatment composition comprises an acid, a source for halide ions and an additive selected from the group consisting of thiourea, thiourea derivatives and polymers comprising thiourea groups wherein the concentration of said additive ranges from 1 to 200 mg/l.

The substrate comprising a copper surface is for example a printed circuit board (PCB) substrate comprising copper contact pads which should be coated with the metal or metal alloy layer deposited by electroless plating thereon, the dielectric base material (e.g. epoxy resins) and a solder mask layer (e.g. an polyacrylate and/or polymethacrylate-based material). Other substrate materials comprising a copper surface are for example devices made of a non-metallic glass such as glass interposers and semiconducting materials such as silicon which optionally also comprises dielectric materials such as dielectric layers made of silicon dioxide and the like.

In all cases, the metal or metal alloy layer should only be deposited onto selected areas of the copper surface which are exposed to the electroless plating bath utilized in step iv. of the process according to the present invention.

The term "electroless plating" means autocatalytic plating, hence the plating baths utilized in step iv. of the process according to the present invention comprises a chemical reducing agent which reduces metal ions in said plating bath to metallic state and thereby deposit a metal or metal alloy layer onto the noble metal activated copper surface.

The copper surface requires an activation prior to electroless metal or metal alloy plating. Compositions for activation of copper surfaces for electroless metal and metal alloy plating, particularly for electroless nickel plating are well known in the art (K. Johal, SMTA International, Chicago, October 2001, Proceedings of the Technical Program, 612-620). Acidic solutions of noble metal ions such as palladium ions are frequently applied for said purpose. Such solutions comprise at least one acid, at least one source of palladium ions and optionally a surfactant.

The at least one acid is preferably selected from the group comprising hydrochloric acid, sulfuric acid, toluene sulfonic acid and methane sulfonic acid. The concentration of the at least one acid preferably ranges from 25 g to 150 g/l, more preferred from 50 g/l to 100 g/l.

The noble metal ions are preferably palladium ions.

The at least one source of palladium ions preferably is selected from the group comprising palladium chloride, palladium sulfate and palladium acetate. The concentration of the at least one source of palladium ions ranges from 10 mg/l to 100 mg/l, more preferably from 30 mg/l to 70 mg/l.

The substrate comprising a copper surface is contacted with such an activator solution at a temperature in the range of 10° C. to 40° C., more preferably of 20° C. to 30° C. for 30 s to 300 s, more preferably for 60 s to 240 s.

Next, the noble metal activator is selectively removed from the substrate comprising a copper surface. It is important, that the noble metal activator only remains on those portions of the copper surface whereon the metal or metal alloy layer is to be deposited by electroless plating. "Selectively removed" means that only noble metal activator deposited between those portions of the copper surface, e.g. between such a portion of the copper surface and the solder mask layer or those portions of the copper surface and the dielectric substrate base material is removed in step iii. of the process according to the present invention.

The acid present in the aqueous pre-treatment composition applied in step iii. of the process according to the present invention is preferably selected from the group consisting of inorganic acids, carboxylic acids, organic sulfonic acids and mixtures thereof. More preferably, the acid is selected from the group consisting of sulfuric acid, methane sulfonic acid, toluene sulfonic acid, phosphoric acid, hydrochloric acid and mixtures thereof.

The pH value of the aqueous pre-treatment composition is ≤3, preferably ≤2 and more preferably ≤1.

The concentration of the acid is selected in order to obtain a pH value of the aqueous pre-treatment composition of ≤3, preferably ≤2 and more preferably ≤1. The required pH value can be determined with conventional pH meters.

The acidic pH value of the aqueous pre-treatment composition is required to clean the copper surface on the substrate and thereby provide a sufficiently clean copper surface for the process according to the present invention.

The aqueous pre-treatment composition further comprises a source for halide ions, preferably a source for chloride and/or bromide ions and more preferably a source for chloride ions. In case hydrochloric acid is selected as the acid, the required amount of halide ions may be provided completely by hydrochloric acid. Other suitable sources for halide ions are for example halides of alkali metals such as lithium chloride, sodium chloride, potassium chloride, lithium bromide, sodium bromide and potassium bromide, the corresponding ammonium halides and alkaline earth halides. Mixtures of different sources for halide ions may be employed in the aqueous pre-treatment composition.

The concentration of halide ions in the aqueous pre-treatment composition preferably ranges from 0.01 to 100 g/l, more preferably from 0.05 to 50 g/l and most preferably from 0.1 to 25 g/l.

Halide ions in the aqueous pre-treatment composition are required to obtain a non-disrupted metal or metal alloy layer on top of the copper surface, e.g. the copper contact pads. Said metal or metal alloy layer must be non-disrupted in order to e.g. serve as a barrier layer between the coated copper contact pads and one or more further metal and/or metal alloy layer(s) plated on top of the metal or metal alloy layer deposited in step iv. of the process according to the present invention.

Skip plating, i.e. a disrupted metal or metal alloy layer on top of a copper contact pad occurs when halide ions are missing in the aqueous pre-treatment composition (Example 4, comparative). Such a disrupted metal or metal alloy layer is not desired.

The aqueous pre-treatment composition further comprises an additive selected from the group consisting of thiourea, thiourea derivatives and polymers comprising thiourea groups.

Thiourea derivatives suitable as the additive in the process according to the present invention are compounds represented by formula (1)

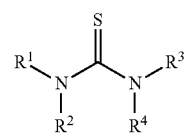

(1)

wherein $R^1$, $R^2$ and $R^3$ are independently selected from the group consisting of H, substituted $C_1$ to $C_6$ alkyl and unsubstituted $C_1$ to $C_6$ alkyl, and $R^4$ is selected from the group consisting of H, substituted $C_1$ to $C_6$ alkyl, unsubstituted $C_1$ to $C_6$ alkyl and —N($R^7$)—C(S)—N$R^5R^6$ wherein $R^5$, $R^6$ and $R^7$ are independently selected from the group consisting of H, substituted $C_1$ to $C_6$ alkyl and unsubstituted $C_1$ to $C_6$ alkyl, preferably, $R^1$, $R^2$ and $R^3$ are independently selected from the group consisting of H, methyl, ethyl, propyl and butyl, and $R^4$ is selected from the group consisting of H, methyl, ethyl, propyl, butyl and —N($R^7$)—C(S)—N$R^5R^6$, and $R^5$, $R^6$ and $R^7$ are independently selected from the group consisting of H, methyl, ethyl, propyl, butyl,
and compounds according to formula (2)

$$R^8\text{—}C(S)\text{—}NR^9R^{10} \qquad (2)$$

wherein $R^8$ is selected from the group consisting of H, substituted $C_1$ to $C_6$ alkyl and unsubstituted $C_1$ to $C_6$ alkyl, and $R^9$ and $R^{10}$ are independently selected from the group consisting of substituted $C_1$ to $C_6$ alkyl and unsubstituted $C_1$ to $C_6$ alkyl.

Substituted $C_3$ to $C_6$ alkyl and unsubstituted $C_3$ to $C_6$ alkyl in general comprise branched $C_3$ to $C_6$ alkyl residues and unbranched $C_3$ to $C_6$ alkyl residues.

Suitable functional groups for substituted $C_1$ to $C_6$ alkyl in compounds according to formulae (1) and (2) are for example hydroxyl and amino residues attached to $C_1$ to $C_6$ alkyl groups. Preferably, $R^8$ is selected from the group consisting of H, methyl, ethyl, propyl and butyl and $R^9$ and $R^{10}$ are independently selected from the group consisting of H, methyl, ethyl, propyl and butyl.

More preferred are thiourea and symmetrically substituted thiourea derivatives according to formula (1) wherein the residue pairs $R^1/R^3$ and $R^2/R^4$ independently have the same substituent selected from the group consisting of H, methyl, ethyl, propyl and butyl.

Most preferably, residues $R^1$, $R^2$, $R^3$ and $R^4$ in thiourea derivatives according to formula (1) are all the same and selected from the group consisting of H, methyl, ethyl, propyl and butyl.

More preferably, $R^9$ and $R^{10}$ of thiourea derivatives according to formula (2) are the same and selected from the group consisting of H, methyl, ethyl, propyl and butyl.

Propyl and butyl residues in general comprise branched and unbranched propyl and butyl residues.

Examples of suitable thiourea derivatives are N-alkyl substituted thiourea derivatives such as dimethylthiourea, diethylthiourea, tetramethylthiourea, thioacetamide and 2,5-dithiodiurea.

The concentration of said additive in the aqueous pre-treatment composition ranges from 1 to 200 mg/l, preferably from 5 to 150 mg/l and more preferably from 10 to 100 mg/l.

In case the concentration of said additive is below 1 mg/l, undesired extraneous plating is not suppressed.

In case the concentration of said additive is above 200 mg/l, undesired skip plating is observed, i.e. a disrupted metal or metal alloy layer is obtained on top of the copper contact pads (Example 5).

The aqueous pre-treatment composition according to the present invention may further contain a surfactant, which can be selected by routine experiments.

Such an optional surfactant improves the wettability of the substrate and may also be required to provide a sufficient solubility of thiourea, thiourea derivative or polymer comprising thiourea groups in the aqueous pre-treatment composition. Particularly butyl substituted thiourea derivatives such as N,N'-dibutylthiourea and N,N,N',N'-tetrabutylthiourea may require a surfactant in order to dissolve said thiourea derivatives in the aqueous pre-treatment composition in a concentration of 1 to 200 mg/l.

The aqueous pre-treatment composition optionally further comprises at least one complexing agent selected from the group consisting of aminocarboxylic acids, hydroxycarboxylic acids and mixtures thereof. Preferred organic aminocarboxylic acids are selected from alanine, aspartic acid, cysteine, glutamic acid, glycine, isoleucine, leucine, lysine, methionine, threonine, valine, N,N-dimethyl glycine, β-alanine, β-leucine, β-isoleucine, β-glutamine, β-glutamic acid, β-methionine, β-asparagic acid. Hydroxycarboxylic acids are preferably selected from lactic acid and citric acid.

The concentration of the optional complexing agent preferably ranges from 0.1 to 100 g/l, more preferably from 0.5 to 50 g/l and most preferably from 1 to 15 g/l. Such a complexing agent can increase the desired properties of the aqueous pre-treatment composition by preventing palladium ions which are dissolved in step iii. of the process according to the present invention to re-deposit onto the substrate.

Undesired extraneous metal or metal alloy plating is not suppressed when applying other sulfur compounds such as 3-mercaptopropan-1-sulfonic-acid and the corresponding disulfide adduct bis-(sodium-sulfopropyl)-disulfide instead of an additive selected from the group consisting of thiourea, thiourea derivatives and polymers comprising thiourea groups (Example 2).

Undesired skip plating on the surface of the copper contact pads is observed when applying sulfur compounds such as thiosulfate and/or thiocyanate ions instead of thiourea, thiourea derivatives and polymers comprising thiourea groups (Examples 3 and 4) or thiourea in a concentration of more than 200 mg/l (Example 5). Hence, in those cases, an undesired disrupted metal or metal alloy layer is obtained by electroless plating onto the copper surface.

At least one additional rinse step between process steps ii. and iii. using essentially water is optional. At least one additional rinse step between process step iii. and iv. using essentially water is optional, but preferred because then an undesired drag over of e.g. thiourea and/or a derivative thereof from the aqueous solution used in step iii. into the autocatalytic metal or metal alloy plating bath used in step iv. shall be minimized.

The substrate comprising an activated copper surface is contacted with the aqueous pre-treatment composition preferably at a temperature of 20° C. to 80° C., more preferably ≤25° C. to 70° C. and most preferably ≤30 to 60° C. The contact time preferably ranges from 10 s to 20 min and more preferably from 1 min to 6 min.

The substrate comprising a copper surface is then suited for electroless metal or metal alloy plating onto the activated copper surface. The metal or metal alloy deposited in step iv. of the process according to the present invention is preferably selected from the group consisting of nickel, Ni—P alloys, Ni—B alloys, Ni—B—P alloys, Ni—Mo—P alloys, Ni—Mo—B alloys, Ni—Mo—B—P alloys, Ni—W—P alloys, Ni—W—B alloys, Ni—W—B—P alloys, Ni—Mo—W—P alloys, Ni—Mo—W—B alloys, Ni—Mo—W—B—P alloys, cobalt, Co—P alloys, Co—B alloys, Co—B—P alloys, Co—Mo—P alloys, Co—W—P alloys, Co—W—B alloys, Co—W—B—P alloys, Co—Mo—W—P alloys, Co—Mo—W—B alloys and Co—Mo—W—B—P alloys, palladium, Pd—B alloys, Pd—P alloys and Pd—B—P alloys.

More preferably, the metal or metal alloy is selected from the group consisting of nickel, Ni—P alloys, Ni—B alloys, palladium, Pd—B alloys and Pd—P alloys.

Suitable plating bath compositions and plating parameters such as bath temperature during plating and plating time for depositing the above mentioned metals and metal alloys are known in the art and can be utilized for step iv. of the process according to the present invention.

Extraneous plating of a metal and metal alloy is suppressed by the process according to the present invention. Furthermore, there is no risk of undesired metal and metal alloy skip plating as re-dissolution of the noble metal activator from the copper surface does not occur when contacting the substrate comprising a copper surface with the aqueous pre-treatment composition in the process according to the present invention. Skip plating means a lack of electroless metal or metal alloy plating on copper surface areas where the copper is not sufficiently activated.

EXAMPLES

The invention will now be illustrated by reference to the following non-limiting examples.

General Procedure:

PCB substrates comprising copper contact pads and a solder mask layer around said copper pads were used throughout all examples. A gap of approximately 10 to 20 µm between the copper contact pads and the solder mask layer exposing the bare dielectric substrate material (reinforced epoxy resin material) was present on all said PCB substrates.

The PCB substrates were contacted with a noble metal activator composition comprising 50 mg/l $Pd^{2+}$ ions and 90 g/l sulfuric acid at a temperature of 23° C. for 3 min (noble metal activation, step ii.).

Next, the PCB substrates with activated copper contact pads where contacted with various aqueous pre-treatment compositions (step iii.) followed by depositing a nickel-phosphorous alloy layer by electroless plating (Examples 1 to 7) onto the activated copper contact pads (Aurotech® HP, a product of Atotech Deutschland GmbH, thickness of the Ni—P alloy layer=5 to 6.5 µm). In example 8, a palladium layer was deposited in step iii. by electroless plating instead of a nickel-phosphorous alloy layer. The palladium layer was deposited from an electroless palladium plating bath according to U.S. Pat. No. 5,882,736.

The PCB substrates were then investigated with a scanning electron microscope (SEM), particularly the gap between the copper contact pads and the solder mask layer in order to determine if undesired extraneous nickel-phosphorous alloy plating or undesired skip plating on top of the copper contact pads had occurred.

Example 1 (Comparative)

The PCB substrate was rinsed with an aqueous pre-treatment solution consisting of 60 g/l sulfuric acid and 5 g/l chloride ions at 20° C. for 5 min (step iii. of the present invention) and then rinsed with water. The substrate surface was investigated with SEM after electroless nickel deposition.

Undesired extraneous plating 3 occurred around the nickel-phosphorous alloy coated copper contact pads 2 on the substrate 1 (FIG. 1).

Example 2 (Comparative)

The PCB substrate was rinsed with a pre-treatment solution consisting of 20 g/l sulfuric acid, 5 g/l chloride ions and 100 mg/l bis-(sodium-sulfopropyl)-disulfide at 45° C. for 3 min (step iii.) and then rinsed with water. The PCB substrate surface was investigated with SEM after electroless nickel plating.

Undesired extraneous plating 3 occurred on the PCB substrate 1 around the nickel-phosphorous alloy coated copper contact pads 2 (FIG. 1).

Example 3 (Comparative)

The PCB substrate was rinsed with a pre-treatment solution consisting of 20 g/l sulfuric acid and 10 mg/l thiocyanate at 45° C. for 3 min (step iii.) and then rinsed with water. The PCB substrate surface was investigated with SEM after electroless nickel plating.

Figure 2:
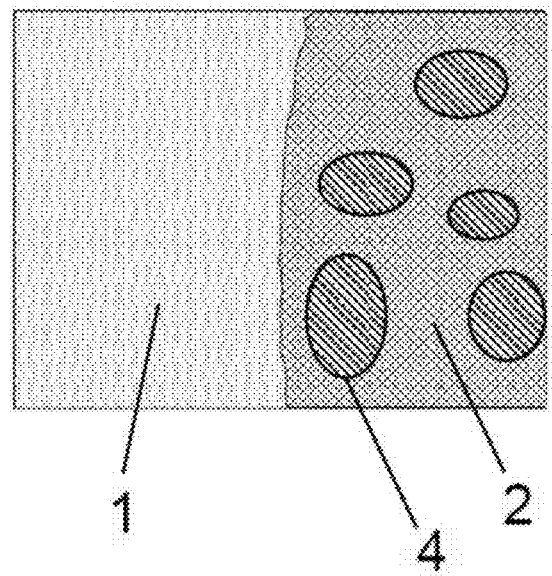
FIG. 2 shows a top view of a copper bond pad coated with a metal (or metal alloy) 2 deposited by autocatalytic plating on a PCB substrate 1 with undesired skip plating 4, i.e. a disrupted metal (or metal alloy) layer on top of the copper contact pad (Examples 3 to 5 and 9 to 10).

Undesired skip plating 4 occurred on the PCB substrate 1 on top of the copper contact pads, i.e. an undesired, disrupted nickel-phosphorous alloy layer 2 on top of the copper contact pads was obtained (FIG. 2).

Example 4 (Comparative)

The PCB substrate was rinsed with an aqueous pre-treatment solution consisting of 15 g/l sulfuric acid and 10 mg/l thiourea at 45° C. for 3 min (step iii.) and then rinsed with water. Accordingly, the aqueous pre-treatment solution utilized was free of halogenide ions. The substrate surface was investigated with a SEM after electroless nickel deposition.

Undesired skip plating 4 was observed, hence the nickel-phosphorous alloy layer on top of the copper contact pads 2 was disrupted (FIG. 2).

Example 5 (Comparative)

The PCB substrate was rinsed with an aqueous pre-treatment solution consisting of 20 g/l sulfuric acid, 3 g/l chloride ions and 250 mg/l thiourea at 45° C. for 3 min (step iii.) and then rinsed with water. Accordingly, the concentration thiourea in the aqueous pre-treatment solution utilized was too high. The substrate surface was investigated with a SEM after electroless nickel deposition.

Undesired skip plating 4 was observed, hence the nickel-phosphorous alloy layer on top of the copper contact pads 2 was disrupted (FIG. 2).

Example 6

The PCB substrate was rinsed with an aqueous pre-treatment solution consisting of 15 g/l sulfuric acid, 10 g/l chloride ions and 10 mg/l thiourea at 45° C. for 3 min (step iii.) and then rinsed with water. The substrate surface was investigated with a SEM after electroless nickel deposition.

Figure 3:
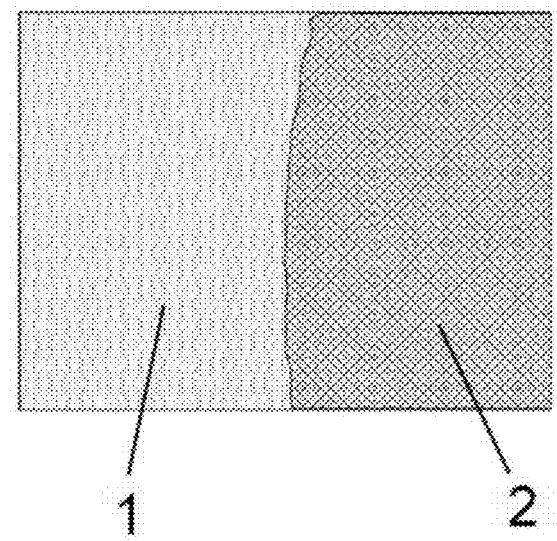
FIG. 3 shows a top view of a copper bond pad coated with a metal (or metal alloy) 2 deposited by autocatalytic plating on a PCB substrate 1. No undesired extraneous plating and undesired skip plating is observed (Examples 6 to 8).

Neither extraneous plating 3 nor skip plating 4 of the nickel-phosphorous alloy layer was observed (FIG. 3).

Example 7

The PCB substrate was rinsed with an aqueous pre-treatment solution consisting of 20 g/l sulfuric acid, 3 g/l chloride ions and 50 mg/l N,N,N',N'-tetramethylthiourea at 45° C. for 3 min (step iii.) and then rinsed with water. The substrate surface was investigated with a SEM after electroless nickel deposition.

Neither extraneous plating 3 nor skip plating 4 of the nickel-phosphorous alloy layer was observed (FIG. 3).

Example 8

The PCB substrate was rinsed with an aqueous pre-treatment solution consisting of 20 g/l sulfuric acid, 3 g/l chloride ions and 50 mg/l N,N,N',N'-tetramethylthiourea at 45° C. for 3 min (step iii.) and then rinsed with water. The substrate surface was investigated with a SEM after electroless palladium deposition.

Neither extraneous plating 3 nor skip plating 4 of the palladium layer was observed (FIG. 3).

Example 9 (Comparative)

The PCB substrate was rinsed with an aqueous alkaline (pH=9) pre-treatment solution consisting of 2.2 g/l sodium chloride ions and 50 mg/l N,N-dimethylthiourea at 45° C. for 3 min (step iii.) and then rinsed with water. The substrate surface was investigated with a SEM after electroless palladium deposition.

Undesired skip plating 4 was observed, hence the nickel-phosphorous alloy layer on top of the copper contact pads 2 was disrupted (FIG. 2).

Example 10 (Comparative)

The PCB substrate was rinsed with an aqueous alkaline (pH=9) pre-treatment solution consisting of 2.2 g/l sodium chloride ions and 50 mg/l thiourea at 45° C. for 3 min (step iii.) and then rinsed with water. The substrate surface was investigated with a SEM after electroless palladium deposition.

Undesired skip plating 4 was observed, hence the nickel-phosphorous alloy layer on top of the copper contact pads 2 was disrupted (FIG. 2).

The invention claimed is:

1. A process for electroless (autocatalytic) metal and metal alloy plating comprising, in this order, the steps of
   i. providing a substrate comprising a copper surface,
   ii. contacting said substrate comprising the copper surface with a noble metal ion containing composition,
   iii. contacting said substrate contacted in step ii with an aqueous pre-treatment composition comprising an acid, a source for halide ions and an additive selected from the group consisting of thiourea compounds according to formula (1)

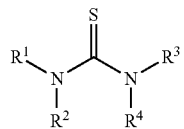

(1)

wherein $R^1$, $R^2$ and $R^3$ are independently selected from the group consisting of H, substituted $C_1$ to $C_6$ alkyl and unsubstituted $C_1$ to $C_6$ alkyl, and $R^4$ is selected from the group consisting of H, substituted $C_1$ to $C_6$ alkyl, unsubstituted $C_1$ to $C_6$ alkyl and —N($R^7$)—C(S)—N$R^5R^6$ wherein $R^5$, $R^6$ and $R^7$ are independently selected from the group consisting of H, substituted $C_1$ to $C_6$ alkyl and unsubstituted $C_1$ to $C_6$ alkyl, compounds according to formula (2)

$$R^8—C(S)—NR^9R^{10} \quad (2)$$

wherein $R^8$ is selected from the group consisting of H, substituted $C_1$ to $C_6$ alkyl and unsubstituted $C_1$ to $C_6$ alkyl and $R^9$ and $R^{10}$ are independently selected from the group consisting of H, substituted $C_1$ to $C_6$ alkyl and unsubstituted $C_1$ to $C_6$ alkyl and polymers comprising thiourea groups, wherein the concentration of said additive ranges from 1 to 200 mg/l and wherein the pH value of the aqueous pre-treatment composition is ≤3 and
   iv. depositing a metal or metal alloy layer onto said substrate by electroless (autocatalytic) plating utilizing a plating bath.

2. The process according to claim 1 wherein the noble metal ion is palladium.

3. The process according to claim 1 wherein the acid is selected from the group consisting of inorganic acids, carboxylic acids, sulfonic acids and mixtures thereof.

4. The process according to claim 1 wherein the source for halide ions is selected from the group consisting of lithium chloride, sodium chloride, potassium chloride and ammonium chloride.

5. The process according to claim 1 wherein the concentration of halide ions in the aqueous pre-treatment composition ranges from 0.01 to 100 g/l.

6. The process according to claim 1, wherein the concentration of the additive in the aqueous pre-treatment composition ranges from 5 to 150 mg/l.

7. The process according to claim 1 wherein $R^1$, $R^2$ and $R^3$ are independently selected from the group consisting of H, methyl, ethyl, propyl and butyl, $R^4$ is selected from the group consisting of H, methyl, ethyl, propyl, butyl and $R^8$ is selected from the group consisting of H, methyl, ethyl, propyl and butyl and $R^9$ and $R^{10}$ are independently selected from the group consisting of H, methyl, ethyl, propyl and butyl.

8. The process according to claim 1 wherein the additive in the aqueous pre-treatment composition is selected from compounds according to formula (1) wherein the residue pairs $R^1/R^3$ and $R^2/R^4$ independently have the same substituent selected from the group consisting of H, methyl, ethyl, propyl and butyl.

9. The process according to claim 1 wherein the additive in the aqueous pre-treatment composition is selected from compounds according to formula (1) wherein residues $R^1$, $R^2$, $R^3$ and $R^4$ are all the same and selected from the group consisting of H, methyl, ethyl, propyl and butyl.

10. The process according to claim 1 wherein the aqueous pre-treatment composition further comprises a complexing agent selected from the group consisting of aminocarboxylic acids, hydroxycarboxylic acids and mixtures thereof.

11. The process according to claim 1 wherein the aqueous pre-treatment composition is held during step iii. at a temperature in the range of 20 to 80° C.

12. The process according to claim 1 wherein the substrate comprising a copper surface is contacted with the aqueous pre-treatment composition in step iii. for 10 s to 20 min.

13. The process according to claim 1 wherein the metal or metal alloy deposited in step iv. is selected from the group consisting of nickel, Ni—P alloys, Ni—B alloys, Ni—B—P alloys, Ni—Mo—P alloys, Ni—Mo—B alloys, Ni—Mo—B—P alloys, Ni—W—P alloys, Ni—W—B alloys, Ni—W—B—P alloys, Ni—Mo—W—P alloys, Ni—Mo—W—B alloys, Ni—Mo—W—B—P alloys, cobalt, Co—P alloys, Co—B alloys, Co—B—P alloys, Co—Mo—P alloys, Co—W—P alloys, Co—W—B alloys, Co—W—B—P alloys, Co—Mo—W—P alloys, Co—Mo—W—B alloys and Co—Mo—W—B—P alloys, palladium, Pd—B alloys, Pd—P alloys and Pd—B—P alloys.

14. The process according to claim 1 wherein in step iii the noble metal is selectively removed from the substrate contacted in step ii such that the noble metal remains only on the copper surface.

* * * * *